US009176839B2

(12) United States Patent
Rajarao et al.

(10) Patent No.: US 9,176,839 B2
(45) Date of Patent: Nov. 3, 2015

(54) BUS TRANSACTION MONITORING AND DEBUGGING SYSTEM USING FPGA

(75) Inventors: Ravishankar Rajarao, Bangalore (IN); Senthil Kumar Balan, Bangalore (IN)

(73) Assignee: WHIZCHIP DESIGN TECHNOLOGIES PVT. LTD., Bangalore, Karnataka (IN)

(*) Notice: Subject to any disclaimer, the term of this patent is extended or adjusted under 35 U.S.C. 154(b) by 204 days.

(21) Appl. No.: 13/473,650

(22) Filed: May 17, 2012

(65) Prior Publication Data

US 2013/0013969 A1 Jan. 10, 2013

(51) Int. Cl.
| G01R 31/28 | (2006.01) |
| G06F 7/02 | (2006.01) |
| H04J 3/24 | (2006.01) |
| H04J 3/04 | (2006.01) |
| G06F 13/36 | (2006.01) |
| G06F 13/14 | (2006.01) |
| G06F 11/32 | (2006.01) |
| G06F 11/30 | (2006.01) |

(52) U.S. Cl.
CPC .............. G06F 11/322 (2013.01); G06F 11/30 (2013.01); G06F 11/302 (2013.01); G06F 11/3003 (2013.01); G06F 11/3065 (2013.01); G06F 11/3072 (2013.01); G06F 11/32 (2013.01)

(58) Field of Classification Search
CPC ... G06F 11/30; G06F 11/3003; G06F 11/302; G06F 11/3065; G06F 11/3072; G06F 11/32; G06F 11/322
USPC .......... 714/733, 819, 820; 710/113, 305, 309, 710/313, 314; 370/474, 535
See application file for complete search history.

(56) References Cited

U.S. PATENT DOCUMENTS

| 7,283,944 | B2 * | 10/2007 | Tsai et al. .................. 703/15 |
| 8,327,039 | B2 * | 12/2012 | Chou et al. ................. 710/22 |
| 8,332,554 | B2 * | 12/2012 | Subbiah et al. ............. 710/71 |
| 8,473,661 | B2 * | 6/2013 | Chou et al. ................ 710/242 |
| 2004/0190553 | A1 * | 9/2004 | Ward et al. ................. 370/474 |
| 2005/0131666 | A1 * | 6/2005 | Tsai et al. .................. 703/17 |
| 2007/0038790 | A1 * | 2/2007 | Lee .......................... 710/113 |
| 2011/0145443 | A1 * | 6/2011 | Chew ........................ 710/15 |
| 2013/0198422 | A1 * | 8/2013 | SUBBIAH et al. ......... 710/71 |

OTHER PUBLICATIONS

McKechnie et al., Debugging FPGA-based Packet Processing Systems through Transaction-level Communication-centric Monitoring, Jun. 19-20, 2009, ACM, pp. 129-136.*

* cited by examiner

*Primary Examiner* — John J Tabone, Jr.
(74) *Attorney, Agent, or Firm* — Barry Choobin; Patent360 LLC

(57) ABSTRACT

The various embodiments herein provide a method and a system for providing a bus transaction monitoring and debugging using FPGA. The system comprises a first FPGA, a second FPGA, application software and a communication interface to connect the second FPGA with the application software. The second FPGA comprises a monitor RTL for tapping data signals from different levels of the first FPGA, a transaction based signal trigger for capturing the signals tapped at different levels of the RTL, a monitor data interface for storing the data signals of interest and a packetizer for converting the signals to a plurality of data packets and transmit the data packets to the application software. The application software decodes the transmitted data packets and displays the transactions on a waveform viewer by communicating the information related to the data packets using a plurality of communication protocols.

12 Claims, 8 Drawing Sheets

US 9,176,839 B2

BUS TRANSACTION MONITORING AND DEBUGGING SYSTEM USING FPGA

CROSS-REFERENCE TO RELATED APPLICATION

The embodiments herein claims the priority of the Indian Provisional Patent Application No. 1717/CHE/2011 filed on May 20, 2011 having the title "Bus Transaction Monitoring And Debugging System", and the contents of which are incorporated by reference herein.

BACKGROUND

1. Technical Field

The embodiments herein generally relates to in-circuit emulation and particularly relates to transaction monitoring and obtaining debugging information using a FPGA (Field Programmable Logic Array) in real-time. The embodiments herein more particularly relate to capturing transaction signals based on a BUS transaction sequence and displaying the signals on a waveform viewer.

2. Description of the Related Art

Currently, for the chip vending industry it is unavoidable to perform various tests on integrated circuit chips with different specifications to verify whether the operation of the design is correct or not. Therefore, the quality assessment and test for several products has become a significant issue in the chip vending industry. The chip vendor companies are facing an unprecedented challenge of balancing the design realization time, cost and the product market life.

The transaction monitoring and debugging system of the existing techniques use a single FPGA for providing user logic to implement a device under Test (DUT) as well as for implementing a processing unit. The processing unit generally requires more memory for implementation due to which the memory allocation for user logic is subsided.

Also as all the implementations are done in a single FPGA, the availability of pins in the FPGA for including user logic to implement a DUT (Device under Test) is considerably less. Further the existing techniques require an expensive and a purpose specific hardware for the implementation of the user logic Hence there exists a need for a transaction monitoring and debugging system which provides adequate memory for user logic implementation. Further there is also a need for a transaction monitoring and debugging system which is less expensive and non-protocol specific. Moreover, there is also a need for a transaction monitoring and debugging system which enables transfer of protocol specific transactions to normal wave form viewers for analysis.

The above mentioned shortcomings, disadvantages and problems are addressed herein and which will be understood by reading and studying the following specification.

OBJECTIVES OF THE EMBODIMENTS

The primary objective of the embodiments herein is to provide a bus transaction monitor and debugging system which provides additional memory to implement the user logic in the FPGA.

Another objective of the embodiments herein is to provide a bus transaction monitor and debugging system which is non-protocol specific.

Yet another objective of the embodiments herein is to provide a bus transaction monitor and debugging system which enables the output to be ported to any waveform viewer for detailed analysis of transactions.

Yet another objective of the embodiments herein is to provide a bus transaction monitor and debugging system for detecting the transactions and the corresponding signals in the integrated circuit using a FPGA.

Yet another objective of the embodiments herein is to provide a bus transaction monitor and debugging system that displays waveforms in the Electronic Design Automation (EDA), waveform viewer related to the transactions detected in the circuit.

Yet another objective of the embodiments herein is that the bus transaction monitor and debugging system which allows the user to select the signals of interest and direct the selected signals to specific pins on the FPGA.

Yet another objective of the embodiments herein is to provide a bus transaction monitor and debugging system which reduces the debugging time.

Yet another objective of the embodiments herein is to provide a bus transaction monitor and debugging system which has a higher functionality coverage based on transaction monitoring.

Yet another object of the embodiments herein is to provide a bus transaction monitor and debugging system that increases the efficiency of the process of capturing signals in a circuit.

Yet another object of the embodiments herein is to provide a bus transaction monitor and debugging system which enables ease of integrating USER DUT register transfer logic.

These and the other objects and advantages of this embodiments herein will be understood easily by studying the following specification with the accompanying drawings.

SUMMARY

The various embodiments herein provide a transaction monitoring and debugging system using FPGA. The system comprises a first FPGA (Field Programmable Gate Array), a second FPGA, application software and a communication interface to connect the second FPGA with the application software. The second FPGA comprises a monitor RTL (Register Transfer Level) for tapping the plurality of data signals from different levels of the first FPGA, a transaction based signal trigger for capturing the plurality of signals tapped at different levels of the RTL, a monitor data interface for storing the plurality of data signals of interest and a packetizer for converting the plurality of signals to plurality of packets and transmit the plurality of packets to the application software. The application software decodes the transmitted packets and displays the transactions on a waveform viewer by communicating the information related to the packets using a plurality of communication protocols.

According to an embodiment of the present disclosure, the first FPGA is a device under test adapted for implementing user logic.

According to an embodiment of the present disclosure, the system further comprises an EDA waveform viewer for displaying the plurality of signals of interest.

According to an embodiment of the present disclosure, the application specific software is adapted to interact with any EDA waveform viewer.

According to an embodiment of the present disclosure, the system further comprises a TAP interface module to sense the change in the plurality of signals and capture the changes.

According to an embodiment of the present disclosure, the application software provides a graphical user interface (GUI) to select signals and integrate the TAP interface in the user RTL.

According to an embodiment of the present disclosure, the TAP interface module is provided with a 32-bit bus for transferring data along with FIFO control and monitor control signals.

According to an embodiment of the present disclosure, the system further includes an application layer for providing information regarding each bit being tapped to the monitor data interface to report an application algorithm regarding the availability of the data.

According to an embodiment of the present disclosure, the application layer includes a control register interface through which the bit positions of the plurality of data signals are intimated to the data packetizer.

According to an embodiment of the present disclosure, the second FPGA further includes a monitor register interface for storing the bit positions of plurality of data signals.

According to an embodiment of the present disclosure, the monitor RTL includes a signal sampling clock generator for generating clock signals, a transaction monitor state machine for processing the plurality of data signals, a register interface for communicating bit positions of plurality of data signals, a transaction based signal trigger and a transaction based bus trigger for forming a control mechanism and a signal store memory for storing the plurality of data signals after occurrence of the required conditions. The control mechanism is formed on the basis of transaction start/end time.

According to an embodiment of the present disclosure, the application software includes an algorithm which allows the user to select the signals of interest in USER DUT and brings out to the specific pins on the first FPGA by auto stitching of the TAP interface logic with the USER DUT RTL.

According to an embodiment of the present disclosure, the algorithm is adapted to generate the relevant information for the second FPGA which is loaded through the control register interface programming the first FPGA and the second FPGA with relevant bit files once the bit file of a first FPGA is ready and loading the trigger control information to the monitor through the control register interface after programming the first FPGA and the second FPGA.

The embodiments herein further provide a method of providing a bus transaction monitoring and debugging using FPGA. The method comprising tapping signals from different levels of the USER DUT RTL (register transfer logic), capturing the signals tapped at different levels, transmitting the captured data signals to a monitor RTL, processing plurality of data signals by the monitor RTL, capturing a plurality of signals of interest based on occurrence of a user-defined set of instructions, converting the plurality of signals of interest into a plurality of data packets by the data packetizer, transmitting the data packets to application software through a communication interface, monitoring the signals transmitted and decoding the packets by an application software and displaying the targeted transactions corresponding to the signal details extracted from the decoded data packets on an EDA waveform viewer.

According to an embodiment of the present disclosure, capturing a plurality of signals of interest based on occurrence of a user-defined set of instructions comprises generating a control mechanism in a transaction based signal trigger of the monitor RTL, loading bit positions of the plurality of signals from a register interface of the monitor RTL and capturing the plurality of signals in a signal store memory based on activity in the signals, once user-defined conditions are met on the monitor RTL.

According to an embodiment of the present disclosure, transmitting the targeted data packets to application software running comprising steps of programming a first FPGA with relevant bit files, programming a second FPGA with the relevant bit files, loading a trigger information into a monitor through a control register interface, programming specifications of pins and the functionality to the MONITOR through the control register interface and feeding the transaction details on a particular signals to the MONITOR.

According to an embodiment of the present disclosure, the application software decodes the packets based on the information regarding the bit correspondence and associates the signal names with each signal such that appropriate signals are mapped with their names in the waveform data to the waveform viewer.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The other objects, features and advantages will occur to those skilled in the art from the following description of the preferred embodiment and the accompanying drawings in which.

Figure 1:
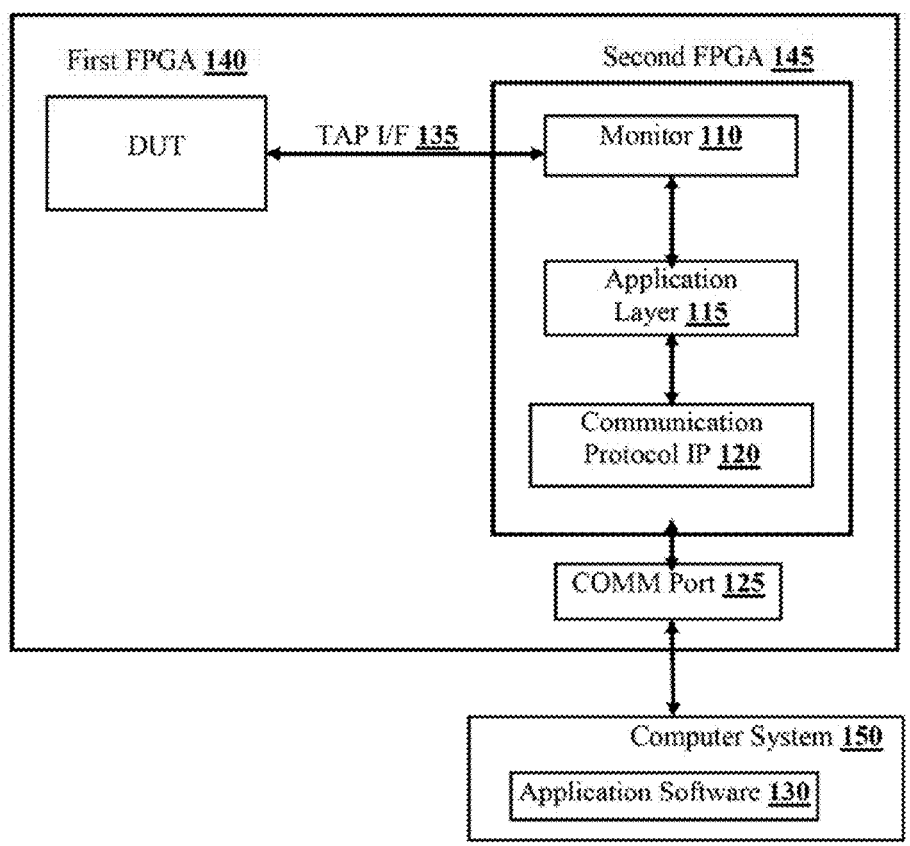
FIG. 1 illustrates a block diagram of a high level design of a bus transaction monitoring and debugging system, according to an embodiment herein.

Although the specific features of the present embodiments are shown in some drawings and not in others. This is done for convenience only as each feature may be combined with any or all of the other features in accordance with the present disclosure.

DETAILED DESCRIPTION OF THE EMBODIMENTS

In the following detailed description, a reference is made to the accompanying drawings that form a part hereof, and in which the specific embodiments that may be practiced is shown by way of illustration. These embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

The various embodiments herein provide a bus transaction monitoring and debugging system using FPGA. The system comprises a first FPGA (Field Programmable Gate Array), a second FPGA, application software and a communication interface to connect the second FPGA with the application software. The second FPGA comprises a monitor RTL (Register Transfer Level) for tapping the plurality of data signals from different levels of the first FPGA, a transaction based signal trigger for capturing the plurality of signals tapped at different levels of the RTL, a monitor data interface for storing the plurality of data signals of interest and a packetizer for converting the plurality of signals to plurality of packets and transmit the plurality of packets to the application software. The application software decodes the transmitted packets and displays the transactions on a waveform viewer by communicating the information related to the packets using a plurality of communication protocols. The first FPGA is a device under test adapted for implementing user logic.

The system further comprises an EDA waveform viewer for displaying the plurality of signals of interest, a TAP interface module to sense the change in the plurality of signals and capture the changes and an application layer for providing information regarding each bit being tapped to the monitor data interface to report an application algorithm regarding the availability of the data.

The application software is adapted to interact with any EDA waveform viewer. The application software provides a graphical user interface (GUI) to select signals and integrate the TAP interface in the user RTL.

The TAP interface module is provided with a 32-bit bus for transferring data along with FIFO control and monitor control signals.

The application layer includes a control register interface through which the bit positions of the plurality of data signals are intimated to the data packetizer.

The second FPGA further includes a monitor register interface for storing the bit positions of plurality of data signals. The monitor RTL includes a signal sampling clock generator for generating clock signals, a transaction monitor state machine for processing the plurality of data signals, a register interface for communicating bit positions of plurality of data signals, a transaction based signal trigger and a transaction based bus trigger for forming a control mechanism and a signal store memory for storing the plurality of data signals after occurrence of the required conditions. The control mechanism is formed on the basis of transaction start/end time.

The application software includes an algorithm which allows the user to select the signals of interest in USER DUT and brings out to the specific pins on the first FPGA by auto stitching of the TAP interface logic with the USER DUT RTL. The algorithm is adapted to generate the relevant information for the second FPGA which is loaded through the control register interface programming the first FPGA and the second FPGA with relevant bit files once the bit file of a first FPGA is ready and loading the trigger control information to the monitor through the control register interface after programming the first FPGA and the second FPGA.

The embodiments herein further provide a method of providing a bus transaction monitoring and debugging using FPGA. The method comprising tapping signals from different levels of the USER DUT RTL (register transfer logic), capturing the signals tapped at different levels, transmitting the captured data signals to a monitor RTL, processing plurality of data signals by the monitor RTL, capturing a plurality of signals of interest based on occurrence of a user-defined set of instructions, converting the plurality of signals of interest into a plurality of data packets by the data packetizer, transmitting the data packets to application software through a communication interface, monitoring the signals transmitted and decoding the packets by an application software and displaying the targeted transactions corresponding to the signal details extracted from the decoded data packets on an EDA waveform viewer.

Transmitting the targeted data packets to application software running comprising steps of programming a first FPGA with relevant bit files, programming a second FPGA with the relevant bit files, loading a trigger information into a monitor through a control register interface, programming specifications of pins and the functionality to the MONITOR through the control register interface and feeding the transaction details on a particular signals to the MONITOR.

The application software decodes the packets based on the information regarding the bit correspondence and associates the signal names with each signal such that appropriate signals are mapped with their names in the waveform data to the waveform viewer.

FIG. 1 illustrates a block diagram of a high level design of a bus transaction monitoring and debugging system, according to an embodiment herein. With respect to FIG. 1, the system includes a first FPGA 140 which is a device under test (DUT) dedicated for implementing the user logic. A TAP interface module 135 functioning as an interface for the first FPGA 140 and the second FPGA 145 taps the signals of interest from different levels of the first FPGA RTL to the TAP interface module 135. The TAP interface module 135 further senses the changes in the signals, captures the changes and transmits the signals along with the details to a monitor RTL 110 of the second FPGA 145.

The monitor RTL 110 is adapted to monitor the signals of interest of the user. The second FPGA 145 further includes an application layer 115 to obtain the details of transactions being done in the monitor RTL 110. The transactions are captured and packetized and the data packets are transmitted to application software 130 running on a computer system 150. The data packets from the application layer 115 are transmitted to the application software 130 through a COMM port 124 which uses a plurality of communication protocols for data transaction such as Ethernet. The plurality of communication protocols includes but is not limited to a SIP, an IF and a TCP. The application software provides user interface (GUI) to select signals and integrate the TAP interface appropriately in the first FPGA 140. The application software 130 allows the user to select the signals to form the bus and the transactions based on those signals which need to be captured. The bus herein means any set of signals, any protocol bus, state machines, state machine control signals, module input or output signals, internal signals of a module, internal register control mechanism and the like.

Figure 2:
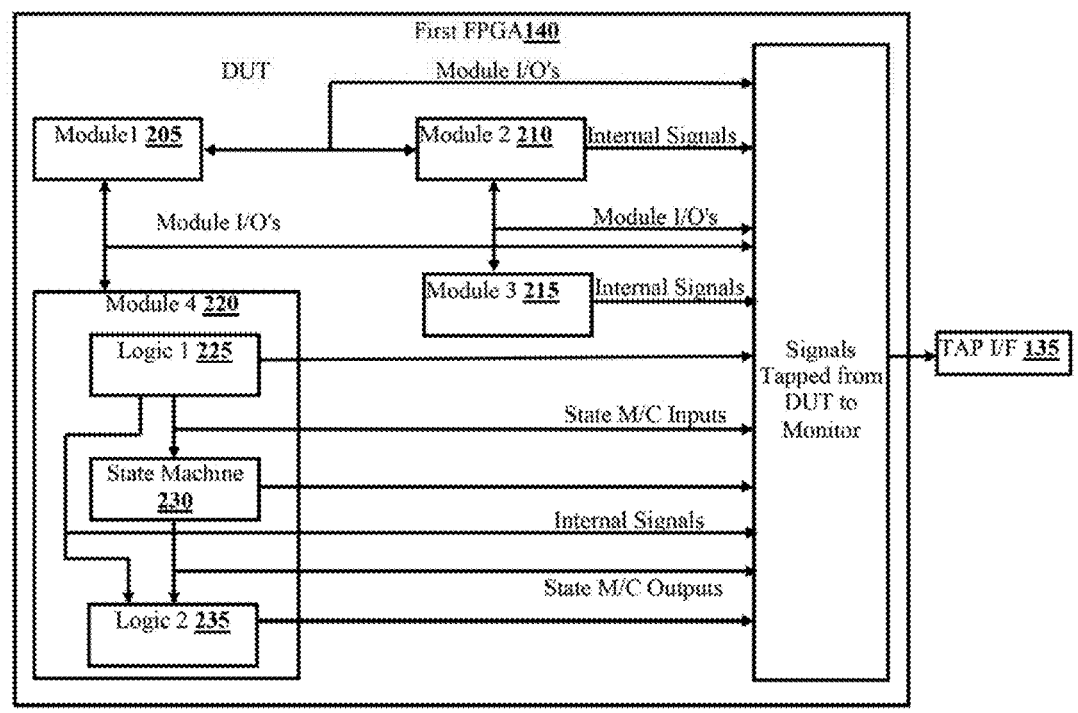
FIG. 2 is a functional flow diagram illustrating the process of tapping the signals from a first FPGA of the bus transaction monitoring and debugging system, according to an embodiment herein.

FIG. 2 is a functional flow diagram illustrating the process of tapping signals from a first FPGA of a bus transaction monitoring and debugging system, according to an embodiment herein. With respect to FIG. 2, the first FPGA 140 includes a first module 205, a second module 210, a third module 215 and a fourth module 220. The fourth module 220 includes logic 1 module 225, a state machine 230 and a logic 2 module 235. The TAP interface module 135 connected to the first FPGA 140 senses the change in the signals and captures the changes. Further the TAP interface module 135 transmits the captured signals to the monitor RTL 110 as per the bus width allocation between the TAP interface module 135 and the monitor RTL 110 of the second FPGA 145.

Figure 3:
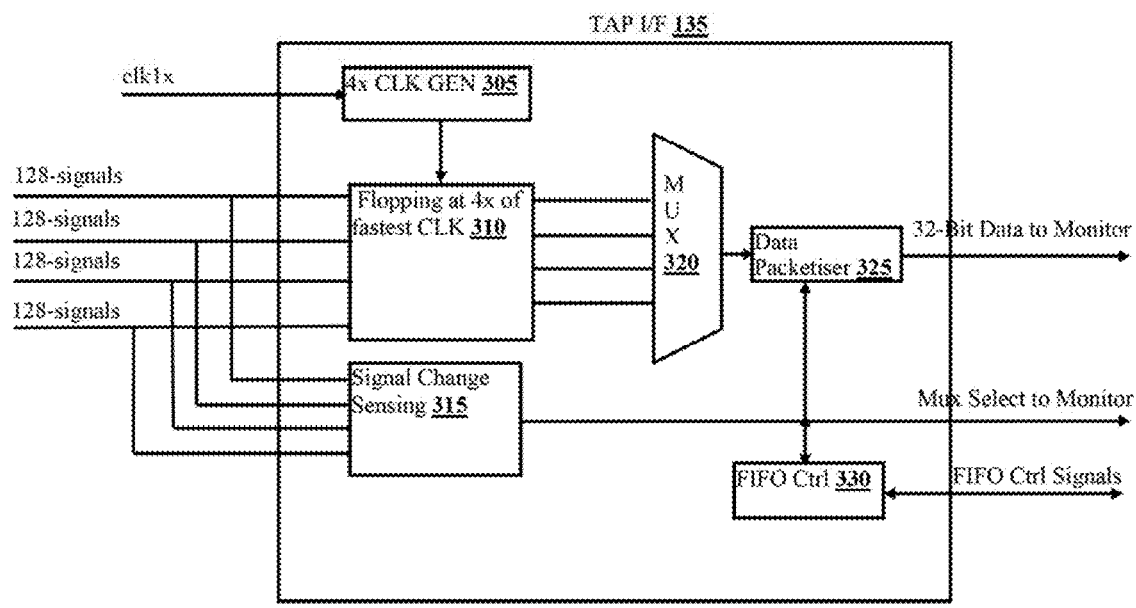
FIG. 3 is a functional block diagram of the TAP interface module, according to an embodiment herein.

FIG. 3 is a functional block diagram of the TAP interface module, according to an embodiment herein. With respect to FIG. 3, the TAP interface module comprises a clock generator 305 to generate clock signals for providing transaction based signal sampling mechanism. The signal change sensing module 315 provided in the TAP interface module 135 senses any change in the signals of interest and captures the data. Further a multiplexer (MUX) 320 provided in the TAP interface module 135 multiplexes the signals to transmit them on a 32 bit bus provided for data transmission along with FIFO control and monitor control signals. The TAP interface module 135 is provided with the fixed number of 32-bit bus for transferring data along with FIFO control and monitor control signals. The number of bits to be transmitted is sent in 32-bit double words and is stored in the FIFO control 330 and monitor control signals. Further the 32-bit double words are processed accordingly for the trigger mechanism. The multiplexed signals are sent to a data packetiser 325 to form the data packets.

Figure 4:
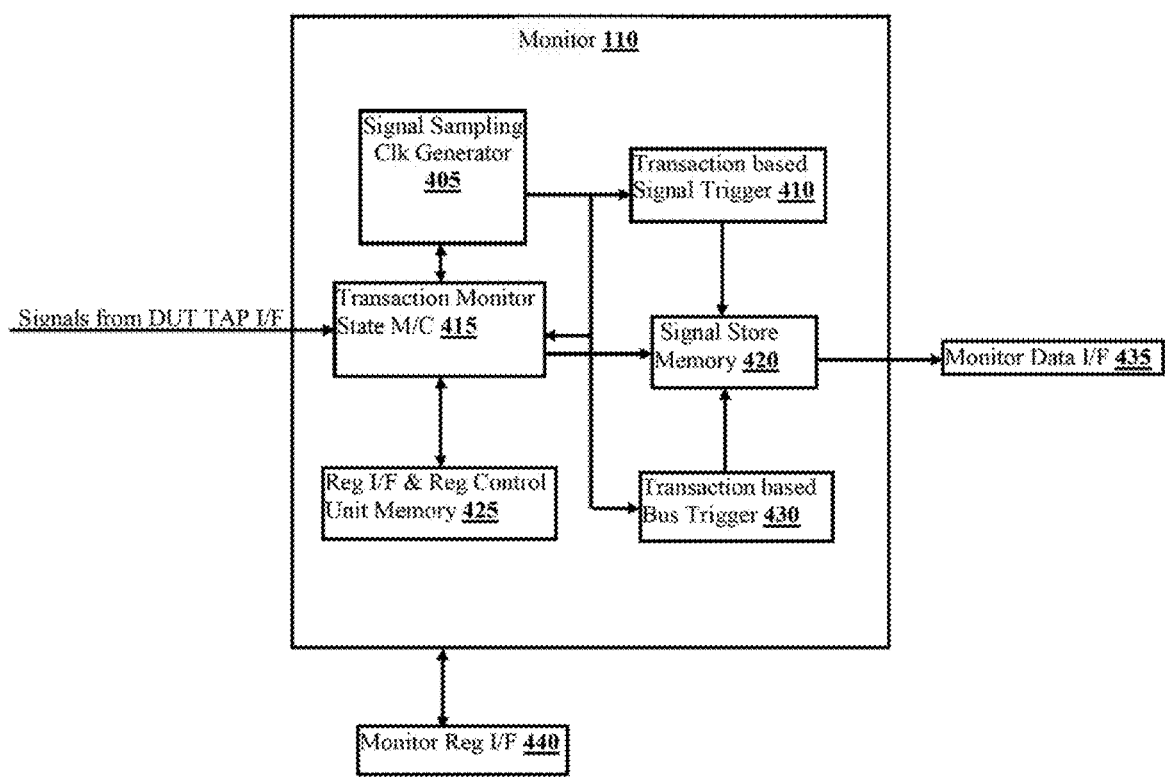
FIG. 4 is a block diagram illustrating a MONITOR RTL in the second FPGA, according to an embodiment herein.

FIG. 4 is a block diagram illustrating a monitor RTL in the second. FPGA, according to an embodiment herein. With respect to FIG. 4, the monitor RTL 110 of the second FPGA 145 receives the tapped signals from the TAP interface module 135. The monitor RTL 110 includes a signal sampling clock generator 405 for the generation of the clock signals for transaction triggering. The monitor RTL 110 also includes a transaction monitor state machine 415, a transaction based signal trigger 410 and a transaction based bus trigger 430. The bit positions of each signal are communicated to the monitor through a register interface 425. The details of the transaction start or end process entered by the user is used to generate a control mechanism in the transaction based bus trigger 430 or the transaction based signal trigger 415. Once the required user conditions are met, the monitor RTL 110 captures the signals in the dedicated memory known as a signal store memory 420 based on the activity of the signals. The monitor RTL 110 also includes a transaction monitor state machine 415 to monitor the captured signals stored in the signal store memory 420. The stored signals from the signal store memory 420 are then sent to a monitor data interface 435.

Figure 5:
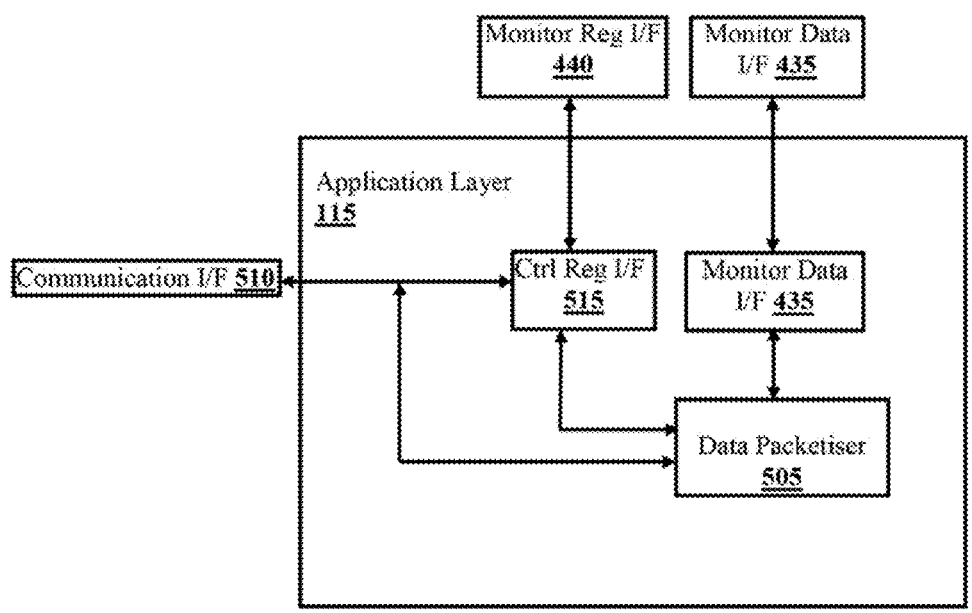
FIG. 5 is a block diagram illustrating the application layer provided in the second FPGA, according to an embodiment herein.

FIG. 5 is a block diagram illustrating the application layer provided in the second FPGA, according to an embodiment herein. With respect to FIG. 5, the application layer 115 loads the information regarding each bit being tapped to the monitor data interface and transaction details through a control register interface 515. A monitor register interface 440 stores the information about the position of each bit of signals. The control register interface 515 of the application layer 115 stores the relevant information programmed by the user to implement the user logic. The control register interface 515 also stores the position information of the signals provided by the monitor register interface 440. The monitor data interface 435 transfers the information regarding the tapped signals and the control register interface 515 transfers the transaction details to a data packetizer 505 provided in the application layer 115. The data packetizer 505 generates data packets corresponding to the tapped signals and the transaction details and transmits the data packet to the application software running on the computer system 150 through the communication interface 510. The application layer 115 is used for reporting the application software regarding the availability of the data after capturing the signals.

Figure 6:
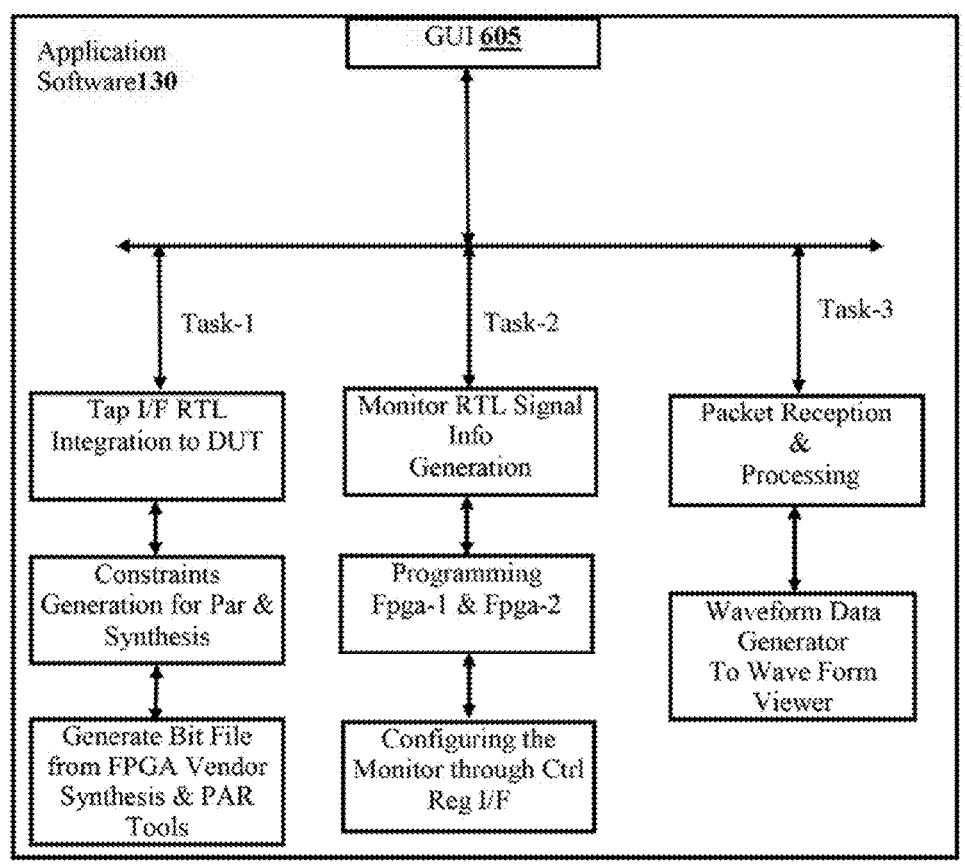
FIG. 6 is a block diagram of a graphical user interface provided by application software installed on a computer system, according to an embodiment herein.

FIG. 6 is a block diagram of a graphical user interface provided by application software installed in a computer system according to an embodiment herein. With respect to FIG. 6, the computer system 150 provides a graphical user interface 605 for the application software 130 installed in the computer system 150. The application software 130 includes an algorithm which allows the user to select the signals of interest and transfer the signals to specific pins on the first FPGA 140. The transfer of signals is performed by auto stitching of the TAP interface logic with the DUT RTL by the algorithm. The relevant constraints required for synthesis and PAR are added to the DUT constraints. The algorithm generates the relevant information for the first FPGA 140 which can be loaded through the control register interface 515. Further once the bit file of a first FPGA 140 is ready, the application software 130 starts programming the first FPGA 140 and the second FPGA 145 with their relevant bit files. After programming the first FPGA 140 and the second FPGA 145, the algorithm loads the trigger control information to the monitor RTL through the control register interface 515. The algorithm programs the details about the pins (signals) and their functionality to the monitor through the monitor register interface. The algorithm also feeds the details about the transactions expected on the particular signals to the monitor such that when the defined events or transactions occur, the signals are captured and send back to the algorithm for processing and debugging.

The task 3 in accordance with FIG. 6 describes that when the signals are captured, the application layer informs the application software 130 regarding the availability of the signal data. The application layer further transfers the data to the application software 130 through the communication interface. The application software 130 further feeds the packet processing logic with the information regarding the bit correspondence and the associated names. Further based on the information provided, the application software 130 decodes the data packets and associates the signal names such that appropriate signals are mapped with their names in the waveform data to the waveform viewer.

Figure 7A:
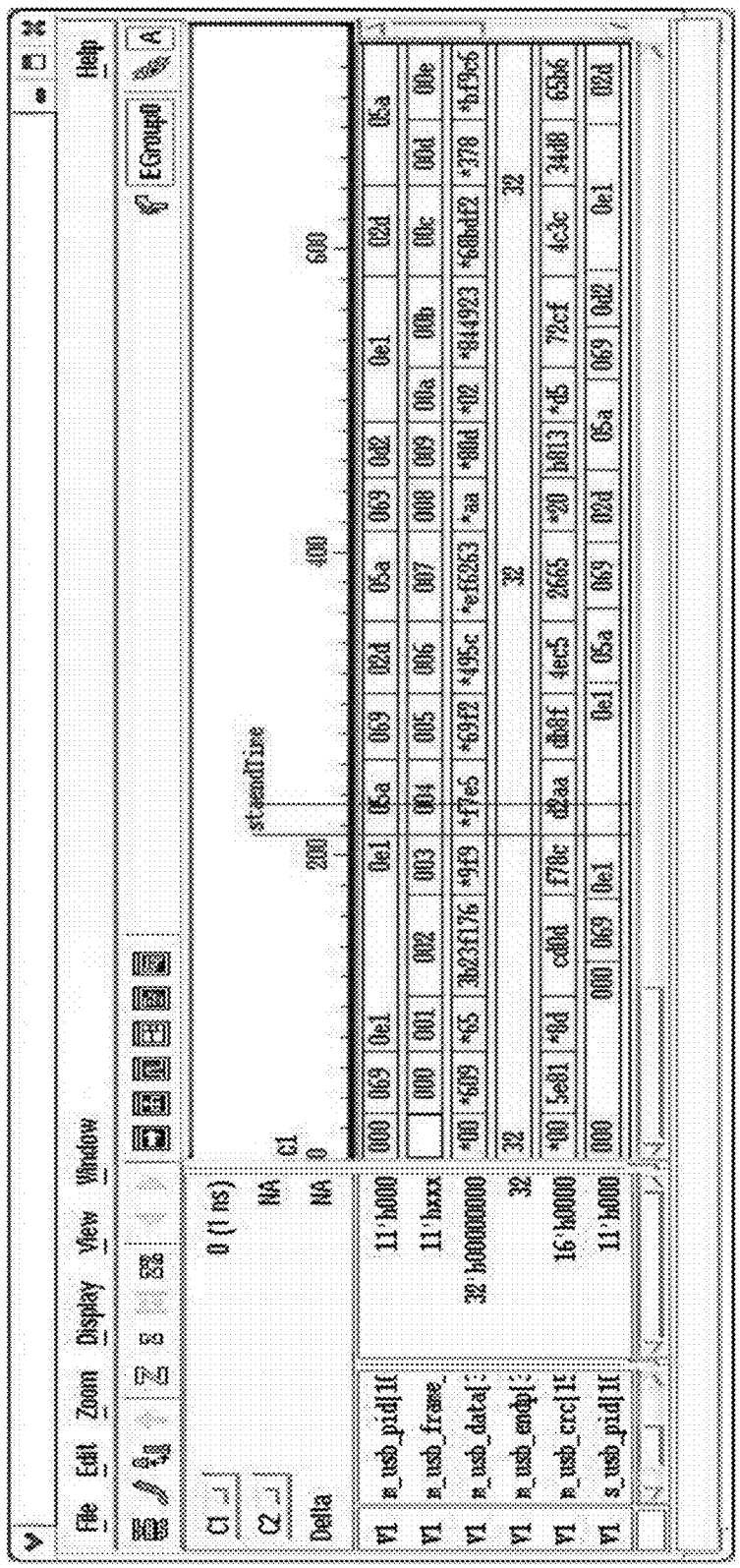
FIG. 7A and FIG. 7B are an exemplary illustration of a waveform generated in the waveform viewer in accordance with the captured signals in the bus transaction monitoring and debugging system, according to an embodiment herein.
Figure 7B:
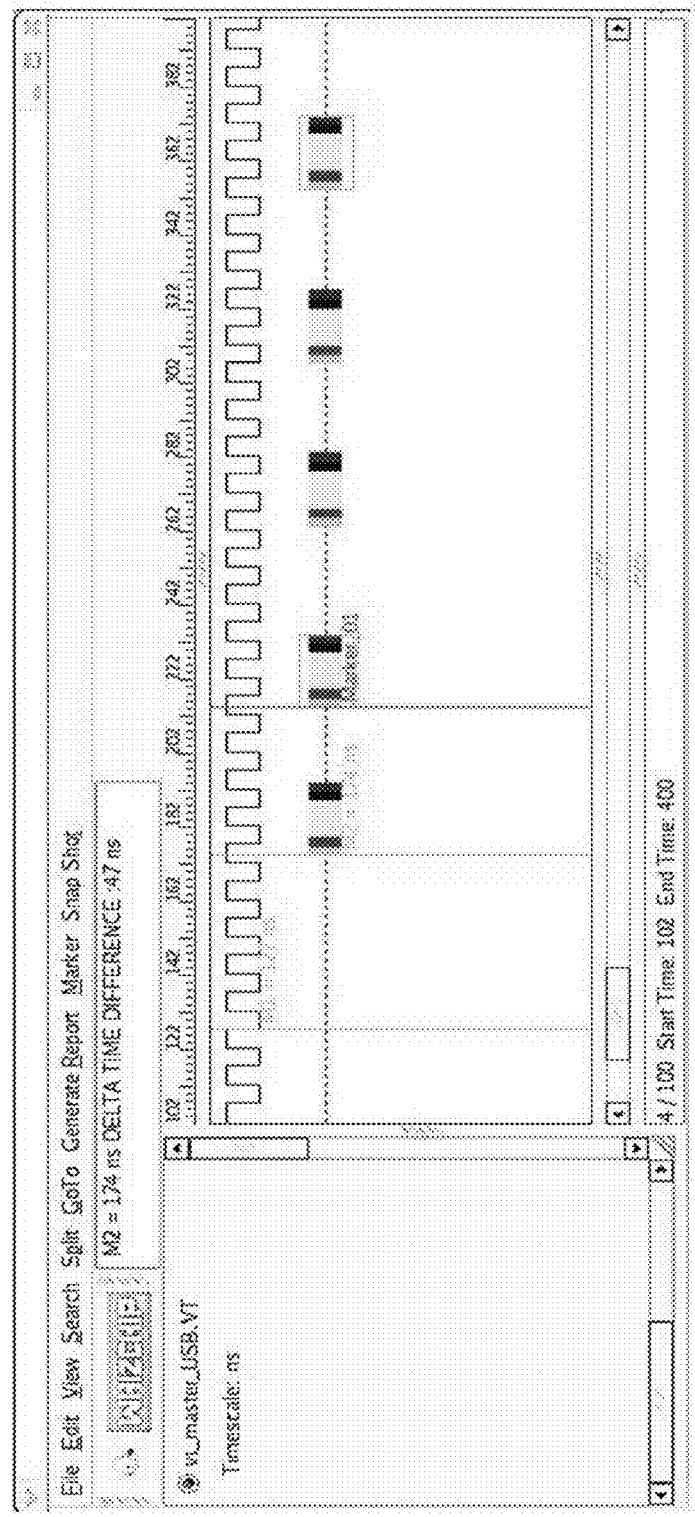

FIG. 7A and FIG. 7B are an exemplary illustration of a waveform generated in the waveform viewer in accordance with the captured signals in the bus transaction monitoring and debugging system according to an embodiment herein. With respect to FIG. 7A and FIG. 7B, the application software 130 decodes the data packets received from the application layer and displays the transactions on the waveform viewer by communicating the information related to the data packets using a plurality of communication protocols.

The embodiments of the present disclosure provide a bus transaction monitor and debugging system that provides additional memory to implement the user logic in the FPGA. The bus transaction monitor and debugging system is non-protocol specific and is less expensive. Further the system enables the signal output to be ported to any form of the waveform viewer for detailed analysis of the transactions. The bus transaction monitor and debugging system increases the efficiency to capture signals and provide transaction specific monitoring. The embodiments herein provide easy integration of USER DUT register transfer logic for capturing signals and details on the captured signals.

The embodiment herein is a combination of hardware and software based application which reduces the debugging time considerably.

The foregoing description of the specific embodiments herein will so fully reveal the general nature of the embodiments herein that others can, by applying current knowledge, readily modify and/or adapt for various applications such specific embodiments herein without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims. Although the embodiments herein are described with various specific embodiments, it will be obvious for a person skilled in the art to practice the embodiments herein with modifications. However, all such modifications are deemed to be within the scope of the claims. It is also to be understood that the following claims are intended to cover all of the generic and specific features of the embodiments described herein and all the statements of the scope of the embodiments which as a matter of language might be said to fall there between.

What is claimed is:

1. A bus transaction monitoring and debugging system, the system comprising:
a first FPGA (Field Programmable Gate Array);
a second FPGA;
an application software; and
a communication interface to connect the second FPGA with the application software;
a TAP interface module to sense a change in a plurality of data signals and capture the change in the plurality of data signals;
wherein the second FPGA comprises:
a monitor RTL (Register Transfer Level) for tapping the plurality of data signals from different levels of the first FPGA;
a transaction based signal trigger for capturing the plurality of signals tapped at different levels of the monitor RTL;
a monitor data interface for storing a plurality of data signals of interest, and wherein the plurality of data signals of interest are selected and captured based on a user-defined set of instructions; and
a data packet for converting the plurality of signals to a plurality of packets and transmit the plurality of packets to the application software;
an application layer for providing an information regarding each bit to a monitor data interface to report an application algorithm regarding an availability of the data, and wherein the application layer includes a control register interface through which bit positions of the plurality of data signals are intimated to the data packetizer;
a monitor register interface for storing the bit positions of the plurality of data signals;
wherein the application software decodes the plurality of transmitted packets and displays the transaction on a waveform viewer by communicating an information related to the packets using a plurality of communication protocols, and wherein the waveform viewer is an Electronic design Automation (EDA) waveform viewer for displaying the plurality of data signals of interest.

2. The system of claim 1, wherein the first FPGA is a device under test adapted for implementing a user logic.

3. The system of claim 1, wherein the application software is adapted to interact with the EDA waveform viewer.

4. The system of claim 1, wherein the application software provides a graphical user interface (GUI) to select a plurality of data signals and integrate the TAP interface in a user RTL.

5. The system of claim 1, wherein the TAP interface module is provided with a 32-bit bus for transferring a data along with a FIFO control and a monitor control signals.

6. The system of claim 1, wherein the monitor RTL includes:
a signal sampling clock generator for generating a plurality of clock signals;
a transaction monitor state machine for processing the plurality of data signals;
a register interface for communicating bit positions of the plurality of data signals;
the transaction based signal trigger and a transaction based bus trigger for forming a control mechanism; and
a signal storage memory for storing the plurality of data signals after an occurrence of required conditions;
wherein the control mechanism is formed on a basis of transaction start/end time.

7. The system of claim 1, wherein the application software includes an algorithm which allows a user to select the plurality of data signals or interest in a USER DUT and brings out to the specific pins on the first FPGA by auto stitching of a TAP interface logic with a USER DUT RTL.

8. The system of claim 7, wherein the algorithm is adapted to:
generate a relevant information for the second FPGA which is loaded through a control register interface;
programming the first FPGA and the second FPGA with relevant bit files once the bit file of the first FPGA is ready; and
loading a trigger control information to the monitor RTL through the control register interface after programming the first FPGA and the second FPGA.

9. A method of providing a bus transaction monitoring and debugging, the method comprises steps of:
tapping a plurality of data signals from different levels of a USER DUT RTL (register transfer logic);
capturing the plurality of data signals tapped from the different levels of the USER DUT RTL;
transmitting the captured plurality of data signals to a monitor RTL;
processing the captured plurality of data signals by the monitor RTL;
capturing a plurality of data signals of interest based on an occurrence of a user-defined set of instructions;
converting the plurality of data signals of interest into a plurality of data packets by a data packetizer;
transmitting the plurality of data packets to an application software through a communication interface;
monitoring the plurality of data signals transmitted and decoding the plurality of data packets by the application software; and
displaying a targeted transactions corresponding to details of the plurality of data signals, and wherein the details of the plurality of data signals are extracted from the decoded plurality of data packets on an Electronic Data Automation (EDA) waveform viewer.

10. The method of claim 9, wherein capturing a plurality of data signals of interest based on a user-defined set of instructions comprises:
generating a control mechanism in a transaction based signal trigger of the monitor RTL;
loading a bit positions of the plurality of data signals from a register interface of the monitor RTL; and capturing the plurality of data signals in a signal store memory based on an activity in the plurality of data signals, when a user-defined conditions are met on the monitor RTL.

11. The method of claim 9, wherein the step of transmitting the plurality of data packets to an application software running, comprising steps of:

programming a first FPGA with a relevant bit files;
 programming a second FPGA with the relevant bit files;
 loading a trigger information into a monitor through a control register interface;
 programming a specification of pins and a functionality to the monitor through the control register interface; and
 feeding transaction details on a particular signal to the monitor.

12. The method of claim 9, wherein the application software decodes the plurality of data packets based on an information regarding a bit correspondence and associates a signal name with each signal in the captured plurality of data signals such that appropriate signals are mapped with respective names in a waveform data to a waveform viewer.

\* \* \* \* \*